(12) United States Patent
Zenasni

(10) Patent No.: US 7,850,863 B2
(45) Date of Patent: Dec. 14, 2010

(54) PROCESS FOR FABRICATING AMORPHOUS HYDROGENATED SILICON CARBIDE FILMS PROVIDED WITH THROUGH-PORES AND FILMS THUS OBTAINED

(75) Inventor: Aziz Zenasni, Gieres (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/353,847

(22) Filed: Jan. 14, 2009

(65) Prior Publication Data

US 2009/0181212 A1 Jul. 16, 2009

(30) Foreign Application Priority Data

Jan. 16, 2008 (FR) .................................... 08 50247

(51) Int. Cl.
*B31D 3/00* (2006.01)
(52) U.S. Cl. .............................. 216/56; 216/57; 216/80; 216/97
(58) Field of Classification Search ................... 216/56, 216/57, 80, 97
See application file for complete search history.

(56) References Cited

U.S. PATENT DOCUMENTS

| | | | |
|---|---|---|---|
| 6,139,626 A | 10/2000 | Norris et al. | |
| 2004/0096593 A1* | 5/2004 | Lukas et al. | 427/558 |
| 2005/0142385 A1* | 6/2005 | Jin | 428/694.001 |
| 2005/0196950 A1* | 9/2005 | Steinhogl et al. | 438/622 |
| 2006/0270201 A1* | 11/2006 | Chua et al. | 438/481 |
| 2007/0190799 A1* | 8/2007 | Wang et al. | 438/750 |
| 2008/0038934 A1* | 2/2008 | Vrtis et al. | 438/759 |

FOREIGN PATENT DOCUMENTS

WO WO 2006/061318 A1 6/2006

OTHER PUBLICATIONS

French Patent Office Search Report, dated Aug. 29, 2008.
M. J. Loboda, "New solutions for internal dielectrics using trimethylsilane-based PECVD process," Elsevier Microelectronic Engineering, vol. 50, pp. 15-23, 2000, XP-002493946.
Sonnenburg et al., "Synthesis and characterization of SiC materials with hierarchical porosity obtained by replication techniques," Physical Chemistry Chemical Physics, vol. 8, pp. 3561-3566, 2006, XP-002493853.

* cited by examiner

*Primary Examiner*—Binh X Tran
(74) *Attorney, Agent, or Firm*—Brinks Hofer Gilson & Lione

(57) ABSTRACT

A process for fabricating a hydrogenated amorphous silicon carbide film having through-pores includes the formation on a substrate of a film consisting of an amorphous hydrogenated silicon carbide matrix in which silicon oxide nanowires are dispersed therethrough, and then the selective destruction by a chemical agent of the silicon oxide nanowires present in the film formed at step a). Applications include microelectronics and micro-technology, in all fabrication processes that involve the degradation of a sacrificial material by diffusion of a chemical agent through a film permeable to this agent for the production of air gaps, in particular the fabrication of air-gap interconnects for integrated circuits.

7 Claims, No Drawings

PROCESS FOR FABRICATING AMORPHOUS HYDROGENATED SILICON CARBIDE FILMS PROVIDED WITH THROUGH-PORES AND FILMS THUS OBTAINED

PRIORITY CLAIM

This application claims priority to French Patent Application No. 0850247, filed Jan. 16, 2008, which is hereby incorporated by reference.

TECHNICAL FIELD

The present invention relates to a process for fabricating amorphous hydrogenated silicon carbide films, also known as a-SiC:H films, which are provided with through-pores, in particular pores that extend from one main surface of these films to the other main surface of said films.

The invention also relates to a-SiC:H films with through-pores.

Such films have, because of their porosity, the property of being permeable to the agents conventionally employed for carrying out chemical etching in the semiconductor industry such as, for example, hydrofluoric acid, while being resistant to these agents. They also have the property of having a low permittivity ("low-k"), in particular a dielectric constant k of generally less than or equal to 4.0.

They are therefore capable of being used in microelectronics and in microtechnology, in all the fabrication processes that involve the degradation of a sacrificial material by diffusion of a chemical etchant through a film permeable to this etchant in order to produce air gaps.

As examples, such processes are employed in the fabrication of integrated-circuit air-gap interconnects, microelectromechanical systems (MEMS) having resonant cavities of the BAW (Bulk Acoustic Wave) type, and also microbatteries.

BACKGROUND

The fabrication of devices in microelectronics or in microtechnology requires, in the most advanced approaches, the production of air gaps.

To produce these air gaps, one of the current approaches consists in degrading a sacrificial material, typically silicon oxide, by means of a chemical etchant, for example hydrofluoric acid, which must pass through a membrane to reach this material.

In addition to being capable of letting the chemical etchant pass through it, this membrane must meet a very precise specification, namely:

it must in itself be resistant to the chemical etchant;
it must be compatible with the various processes and treatments employed for producing the structure in which it is integrated (metallization operations, chemical-mechanical polishing operations, thermal annealing operations, and the like) and, in particular, it must be stable at temperatures that may reach 400° C.;
it must have satisfactory mechanical properties since it forms part of the framework of the structure; and
it must have a low dielectric constant, i.e. at most equal to 4.0, in the case of an interconnect structure for integrated circuits.

Amorphous hydrogenated silicon carbide is a material that can be potentially used for the production of such membranes but however with the condition of being able to be made porous.

This is because an aqueous solution, for example a hydrofluoric acid solution, is incapable of penetrating a non-porous hydrogenated silicon carbide film, not only because of the absence of penetration regions, but also because of the hydrophobicity of the surface of this film.

Obtaining a porous amorphous hydrogenated silicon carbide film is therefore itself a challenge.

One of the approaches most frequently used to obtain a porous film consists in producing a composite film comprising, on the one hand, a matrix formed from a polymerizable material and, on the other hand, a pore-forming agent dispersed in this matrix, and then, after the material of the matrix has been polymerized, in extracting said pore-forming agent from the matrix, for example by thermal decomposition.

However, this approach cannot be used for the production of porous amorphous hydrogenated silicon carbide films because of the hydrocarbon nature of the pore-forming agents.

SUMMARY

The subject of the present invention is specifically a process that enables a porous amorphous hydrogenated silicon carbide film to be fabricated.

This process comprises:

a) the formation on a substrate of a film consisting of an amorphous hydrogenated silicon carbide matrix in which silicon oxide through-nanowires (in particular nanowires which extend from one main surface of the matrix to the other main surface of said matrix) are dispersed; and then b) the selective destruction by a chemical agent of the silicon oxide nanowires present in the film formed at step a), this having the effect of converting these nanowires into diffusion through-channels or through-pores.

In accordance with the invention, the silicon oxide nanowires preferably have a diameter ranging from a few nm to a few tens of nm, and better still from 2 nm to 10 nm.

Moreover, step a) preferably comprises the formation of the silicon oxide nanowires on the substrate and then the formation of the amorphous hydrogenated silicon carbide matrix around these nanowires.

Silicon oxide nanowires may be formed on a substrate by many techniques well known to those skilled in the art, and in particular by CVD (chemical vapour deposition), CCVD (catalytic chemical vapour deposition), carbothermic reduction, laser ablation or else by the sol-gel route.

However, within the context of the invention, it is preferred to produce the nanowires by the sol-gel route.

The amorphous hydrogenated silicon carbide matrix is preferably formed by the PECVD (plasma-enhanced chemical vapour deposition) technique starting from pairs of precursors of the trimethylsilane/helium or silane/methane type. Specifically, owing to the fact that this technique permits deposition at low pressure, it enables the nanowires to be covered, over their entire length, with amorphous hydrogenated silicon carbide, it being understood that care shall be taken to adjust the duration of the a-SiC:H deposition so that the ends of the nanowires are not included in the matrix and can thus remain accessible to the chemical agent.

As indicated above, the silicon oxide nanowires are then selectively destroyed by means of a chemical agent in order to make the film permeable. This chemical agent must therefore be capable of degrading the silicon oxide while keeping the amorphous hydrogenated silicon carbide matrix intact.

One chemical compound that has this property is hydrofluoric acid, which is widely used in the semiconductor industry and the use of which is therefore fully controlled.

Therefore, the chemical agent used in step b) is preferably a fluid containing hydrofluoric acid.

In accordance with the invention, this fluid is preferably an aqueous or organic hydrofluoric acid solution, for example at 1 or a few % (v/v) of HF, in which case step b) may be carried out by simply dipping the film into this solution.

However, it may also be gaseous hydrofluoric acid, whether pure or mixed with a carrier gas such as nitrogen, or a mixture of hydrofluoric acid and supercritical carbon dioxide, for example in a ratio of 1/100 (v/v).

As a variant, the chemical agent may also be a fluid containing ammonium fluoride, advantageously as a mixture with hydrofluoric acid.

The subject of the invention is also a hydrogenated amorphous silicon carbide film that includes through-pores.

Preferably, this film has a thickness ranging from 50 nm to 10 μm, and better still from 100 nm to 1 μm, and pores having a diameter ranging from a few nm to a few tens of nm, and better still from 2 nm to 10 nm.

The subject of the invention is also a film useful for the production of a hydrogenated amorphous silicon carbide film having through-pores, which consists of an amorphous hydrogenated silicon carbide matrix in which silicon oxide through-nanowires are dispersed.

Preferably, this film has a thickness ranging from 50 nm to 10 μm, and better still from 100 nm to 1 μm, and silicon oxide nanowires having a diameter ranging from a few nm to a few tens of nm, and better still from 2 nm to 10 nm.

The subject of the invention is also the use of these films in the fabrication of an air-gap interconnect structure for integrated circuits.

Other features and advantages of the invention will become more clearly apparent on reading the following description, which relates to examples of how the process according to the invention may be implemented.

Of course, these examples are given merely by way of illustration of the subject matter of the invention and in no way constitute a limitation of this subject matter.

DETAILED DESCRIPTION

Example 1

A thin layer of $SiO_2$ 200 nm in thickness is deposited by PECVD on a silicon wafer using a mixture of triethylorthosilane and oxygen.

The deposition is carried out in a capacitively coupled reactor of the Centura 5200 DxZ type from the company Applied Materials, using the following operating parameters:
radiofrequency excitation: 13.56 MHz;
working pressure: 8.2 torr (1 kPa);
power: 910 W;
deposition temperature: 400° C.;
triethylorthosilane flow rate: 1000 mg/min;
Oxygen flow rate: 1000 cm³/min; and
deposition duration: 25 seconds.

Next, the $SiO_2$ nanowires are formed on the thin $SiO_2$ layer.

To do this, a first solution is prepared by gradually adding 52 ml of TEOS (tetraethylortho-silicate) containing 115 mL of ethanol and a second solution is prepared by mixing 115 mL of ethanol with 18 mL of water and 0.27 mL of hydrochloric acid. The second solution is then added to the first. The resulting mixture is spin-coated on the multilayer formed by the silicon wafer and the $SiO_2$ layer that covers it, and this is all placed in a heated chamber (at 200° C.) for 12 hours.

Next, the a-SiC:H matrix is formed, by PECVD, around the $SiO_2$ nanowires thus obtained, using trimethylsilane and helium, for example in a capacitively coupled reactor of the Centura® 5200 DxZ type from the company Applied Materials, and by using the following operating parameters:
radiofrequency excitation: 13.56 MHz;
working pressure: 4 torr (533 Pa);
power: 250 W;
deposition temperature: 350-400° C.;
trimethylsilane flow rate: 350 cm³/min;
helium flow rate: 4900 cm³/min; and
deposition duration: 8 minutes.

The surface of the matrix thus formed then undergoes mechanical polishing of the surface of the film thus formed for 10 seconds, by means of a basic (pH 8) aqueous suspension of colloidal silica particles and using a plate rotation speed of 80 rpm and a pressure of 2 psi (13.789 kPa).

The multilayer is then immersed in a 1% (v/v) aqueous hydrofluoric acid solution for 10 minutes.

What is thus obtained is an a-SiC:H film provided with through-pores having a dielectric constant of less than 4.0.

Example 2

A thin layer 200 nm in thickness of $SiO_2$ is deposited on a silicon wafer by PECVD using a mixture of triethylorthosilane and oxygen.

The deposition is carried out in a capacitively coupled reactor of the Centura® 5200 DxZ type from the company Applied Materials, using the following operating parameters:
radiofrequency excitation: 13.56 MHz;
working pressure: 8 torr (1 kPa);
power: 910 W;
deposition temperature: 400° C.;
triethylorthosilane flow rate: 1000 mg/min;
oxygen flow rate: 1000 cm³/min; and
deposition duration: 25 seconds.

Next, the multilayer thus obtained is placed in a furnace reactor. Silicon powder is deposited uniformly on the $SiO_2$ layer and this structure is placed on the alumina tube of the furnace, the internal pressure of which is set at $6.10^{-2}$ torr (8 Pa). The furnace is heated to a temperature of 800° C. at a rate of 10° C. per minute, held at this temperature for 30 minutes, then heated to 1300° C., again at a rate of 10° C./min, and held at this temperature for 5 hours. Once the temperature of 1300° C. has been reached, a stream of ultrapure argon, i.e. argon having a degree of purity of 99.99% with an $H_2$ content of at most 1 ppm, an $H_2O$ content of at most 20 ppm, an $O_2$ content of at most 20 ppm and a content of hydrocarbon compounds of at most 6 ppm, is introduced into the furnace, at a rate of 50 cm³/min and at a pressure of 300 torr (40 kPa).

After this, the a-SiC:H matrix is formed, around the $SiO_2$ nanowires thus obtained, by PECVD using tetramethylsilane and helium, for example in a capacitively coupled reactor of the Centura® 5200 DxZ type from the company Applied Materials, and using the following operating parameters:
radiofrequency excitation: 13.56 MHz;
working pressure: 4 torr (533 Pa);
power: 250 W;
deposition temperature: 350-400° C.;
tetramethylsilane flow rate: 350 cm³/min;
helium flow rate: 4900 cm³/min; and
deposition duration: 8 minutes.

Next, the surface of the matrix thus formed is subjected to a chemical-mechanical polishing operation, precisely under the same conditions as those described in example 1.

The multilayer is then immersed in a 1% (v/v) aqueous hydrofluoric acid solution for 10 minutes.

What is thus obtained is an a-SiC: H film provided with through-pores and having a dielectric constant of less than 4.0.

The invention claimed is:

1. A process for fabricating a hydrogenated amorphous silicon carbide film having through-pores, the process comprising:
    a) forming a film on a substrate, the film comprising an amorphous hydrogenated silicon carbide matrix having silicon oxide nanowires dispersed therethrough; and
    b) applying a chemical agent to remove the silicon oxide nanowires in the film, thereby forming the through-pores.

2. The process according to claim 1, wherein forming the film comprises forming the silicon oxide nanowires on the substrate followed by forming the amorphous hydrogenated silicon carbide matrix around the nanowires.

3. The process according to claim 2, wherein forming the silicon oxide nanowires comprises a sol-gel process or a chemical vapour deposition process.

4. The process according to claim 2, wherein forming the amorphous hydrogenated silicon carbide matrix comprises a plasma-enhanced chemical vapour deposition process.

5. The process according to claim 1, wherein applying the chemical agent comprises applying a fluid comprising hydrofluoric acid.

6. The process according to claim 5, wherein the fluid comprises an aqueous or organic hydrofluoric acid solution.

7. The process according to claim 5, wherein the fluid comprises gaseous hydrofluoric acid, a mixture of gaseous hydrofluoric acid and a carrier gas, or a mixture of hydrofluoric acid and supercritical carbon dioxide.

* * * * *